US008575977B1

(12) United States Patent
Philpott et al.

(10) Patent No.: US 8,575,977 B1
(45) Date of Patent: Nov. 5, 2013

(54) LOW VOLTAGE SUPPLY COMPARATOR AND A METHOD TO OPERATE THE COMPARATOR

(75) Inventors: Justin Jon Philpott, San Francisco, CA (US); Arvind Sherigar, Santa Clara, CA (US); Jeffery Chow, San Jose, CA (US); Ping-Chen Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/428,912

(22) Filed: Mar. 23, 2012

(51) Int. Cl.
*H03L 7/00* (2006.01)
(52) U.S. Cl.
USPC .................. 327/143; 327/53; 327/66; 327/77
(58) Field of Classification Search
USPC ............. 327/63, 143, 198, 52, 53, 65, 66, 77, 327/78, 79, 89
See application file for complete search history.

(56) References Cited

U.S. PATENT DOCUMENTS

| | | | | |
|---|---|---|---|---|
| 5,280,198 A | * | 1/1994 | Almulla | 327/535 |
| 6,346,834 B1 | * | 2/2002 | Chai | 327/143 |
| 6,882,199 B2 | * | 4/2005 | Sugimura | 327/198 |

* cited by examiner

*Primary Examiner* — Lincoln Donovan
*Assistant Examiner* — Jung H. Kim
(74) *Attorney, Agent, or Firm* — Womble Carlyle Sandridge & Rice, LLP

(57) ABSTRACT

A comparator is disclosed. The comparator includes a mirror circuit that is electrically coupled to a first voltage source and a second voltage source. The first voltage source produces a first voltage and the second voltage source produces a second voltage. The comparator also includes a first positive metal oxide semiconductor (PMOS) transistor electrically coupled to the first voltage source and an output terminal. The first PMOS transistor is biased by the mirror circuit. The comparator also includes a first negative metal oxide semiconductor (NMOS) that is electrically coupled to a ground terminal and the output terminal. The first NMOS transistor is also biased by the mirror circuit. An electrical current flowing across the first NMOS transistor is mirrored from an electrical current flowing through the first PMOS transistor. A method to operate the comparator and a comparator system is also disclosed.

17 Claims, 5 Drawing Sheets

LOW VOLTAGE SUPPLY COMPARATOR AND A METHOD TO OPERATE THE COMPARATOR

BACKGROUND

A hot-socketing feature allows insertion or removal of a circuit board without requiring to power down a system. The circuit board having the hot-socketing feature is capable to be powered up immediately when inserted into the powered system. Therefore, the circuit board, which houses integrated circuits (ICs), minimizes propagation of electrical current within the ICs, especially the electrical current across junction diodes within the ICs.

Current hot-socketing techniques utilize a comparator that blocks the electrical current propagating through the junction diodes when the IC is powering up. The comparator ensures that the junction diodes are not forward-biased to prevent drawing a large amount of current. Therefore, the comparator needs to function as early as possible, as voltage supplies ramp up.

However, the minimum supply voltage at which the comparator correctly functions is limited by its circuit architecture. The comparator has a relatively small input-referred offset when powered by a relatively high voltage supply. In contrast, when the comparator is powered by a relatively low voltage supply, the input-referred offset increases dramatically. This compromises the comparator functionality, leading to a relatively high amount of electrical current flowing through the junction diodes.

It is within this context that the embodiments described herein arise.

SUMMARY

Embodiments described herein provide a low voltage supply comparator and a method to operate the comparator. It should be appreciated that the present embodiments can be implemented in numerous ways, such as a process, an apparatus, a system, a device, or a method. Several inventive embodiments of the present invention are described below.

In one embodiment, a comparator is described. The comparator includes a mirror circuit that is electrically coupled to a first voltage source and a second voltage source. The comparator also includes a first P-type Metal Oxide Semiconductor (PMOS) transistor electrically coupled to the first voltage source and an output terminal of the comparator. The first PMOS transistor is biased by an output of the mirror circuit. The comparator also includes a first N-type Metal Oxide Semiconductor (NMOS) that is electrically coupled to a ground terminal and the output terminal. The first NMOS transistor is biased by the output of the mirror circuit. An electrical current flowing across the first NMOS transistor has a current value substantially equivalent to an electrical current flowing through the first PMOS transistor.

In another embodiment, a method to operate a comparator is provided. The method includes receiving a first voltage and a second voltage to the comparator. Then, the method includes generating a first electrical current within the comparator. The first electrical current is generated from the first and second voltages. The method also includes biasing a first PMOS transistor with a second electrical current. The second electrical current has an electrical current value of less than a value of the first electrical current. Then, the method includes mirroring the second electrical current so that the second electrical current can be applied to a first NMOS transistor. The method also includes biasing the first NMOS transistor with the second electrical current. The second electrical current through the first NMOS transistor is substantially equivalent to the second electrical current through the first PMOS transistor.

In another embodiment, a comparator system is provided. The comparator system includes a comparator that compares a first voltage to a second voltage. The comparator generates a zero offset current when the first voltage and the second voltage places the characteristics of the comparator into a linear region of current to voltage (I-V) relationship. The comparator also includes an output PMOS transistor. The gate of the output PMOS transistor is coupled to an output of the comparator.

Other aspects of the embodiments will become apparent from the following detailed description, taken in conjunction with the accompanying drawings, illustrating by way of example of the principle of the invention.

BRIEF DESCRIPTION OF THE DRAWINGS

The invention may be understood by reference to the following description taken in conjunction with the accompanying drawings.

DETAILED DESCRIPTION

The following embodiments describe a low voltage supply comparator and a method to operate the comparator. It will be obvious, however, to one skilled in the art, that the present embodiments may be practiced without some or all of these specific details. In other instances, well-known operations have not been described in detail in order not to unnecessarily obscure the present embodiments.

Figure 1:
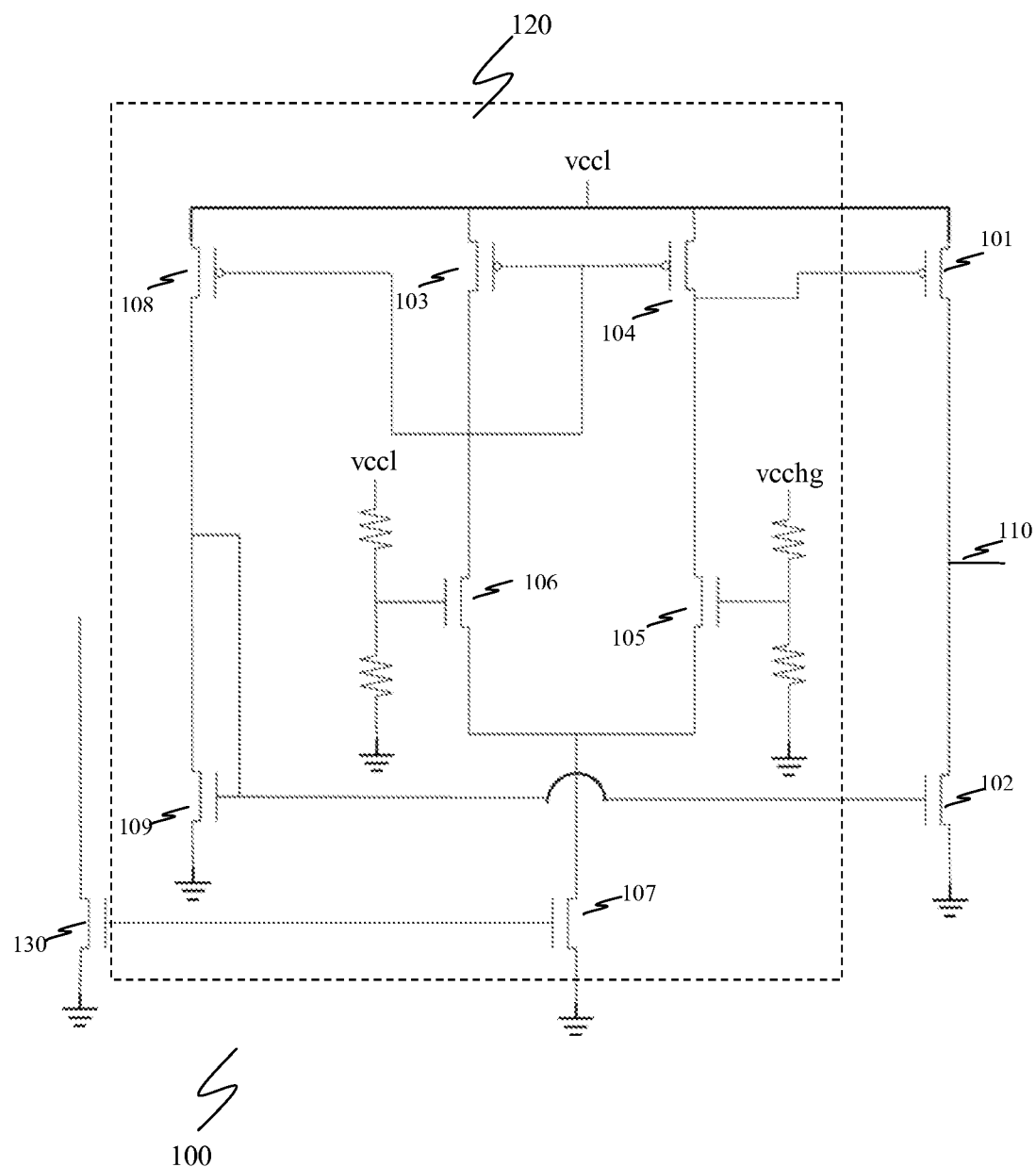
FIG. 1, meant to be illustrative and not limiting, illustrates a comparator supporting a low common mode voltage in accordance with one embodiment.

FIG. 1, meant to be illustrative and not limiting, illustrates a comparator supporting a low common mode voltage in accordance with one embodiment. Comparator 100 includes PMOS transistor 101, NMOS transistor 102 and mirror circuit 120. Comparator 100 outputs an electrical current through output terminal 110. Comparator 100 compares two input voltages, i.e., an internal supply voltage (Vccl) and a bulk voltage (Vcchg), in one embodiment. It should be appreciated that, comparator 100 enables comparison of any two voltages supplied, which may be referred to as a first voltage and a second voltage. Comparator 100 has a high input common mode range, in which comparator 100 is capable of supporting applications ranging from low input voltages to high input voltages.

Mirror circuit 120 is supplied with the first voltage and the second voltage, e.g., Vccl and Vcchg, which in turn maybe supplied by a first voltage source and a second voltage source, respectively. In one embodiment, the first and second voltages are low voltages, e.g., voltages lower than 1V, which provides a low common mode voltage. PMOS transistor 101 that has a source, drain and gate are electrically connected to the first voltage source, output terminal 110, and mirror circuit 120, respectively. NMOS transistor 102 that has a source, drain and gate are electrically connected to output terminal 110, a ground terminal, and mirror circuit 120, respectively. It should be appreciated that PMOS transistor 101 and NMOS transistor 102 form an output stage of the comparator. The output stage of comparator 100 is biased to a fixed electrical current enabling comparator 100 to perform with a larger Input Common Mode Ranges (ICMRs). In one embodiment, the common mode has a range that includes input voltages of 0.7V up to a voltage level where the comparator break down.

Still referring to FIG. 1, an equivalent amount of electrical current is supplied to the gates of PMOS transistor 101 and NMOS transistor 102 through mirror circuit 120 in one embodiment. It should be appreciated that the electrical current flowing across PMOS transistor 101 and NMOS transistor 102 is determined by the amount of electrical current supplied/biased to the gates of the respective transistors. Therefore, the electrical current flowing through PMOS transistor 101 and NMOS transistor 102 are substantially equivalent because both of the transistors are supplied/biased by an identical electrical current, in one embodiment. In another embodiment, the electrical current flowing through PMOS transistor 101 and NMOS transistor 102 has zero offset, i.e., no differences. In contrast, a conventional comparator suffers from high offsets at low input voltage/low common mode voltage. This is because the conventional comparator, which also has at least two transistors at the comparators output, i.e., an NMOS and a PMOS, where the NMOS is biased to a fixed electrical current, but, the PMOS is biased to an electrical current that is dependent on the input common mode voltages. Therefore, when the input common mode voltages drop below a specific value, the difference between the electrical current across the NMOS and PMOS is significant. Hence, such architecture suffers from large offsets when supplied to low input voltages.

Still referring to FIG. 1, mirror circuit 120 includes PMOS transistors 103, 104 and 108 and NMOS transistors 105, 106, 107 and 109. For PMOS transistor 104, the source is electrically coupled to the first voltage source; the drain is electrically coupled to the gate of PMOS transistor 101; and the gate is electrically coupled to the gate and the drain of PMOS transistor 103. As for PMOS transistor 103, the source is electrically coupled to the first voltage source; the drain is electrically coupled to the gates of PMOS transistors 103, 104 and 108; and the gate is electrically coupled to the gate of PMOS transistor 104 and the drain of PMOS transistor 103. As for NMOS transistor 105, the source is electrically coupled to the drain of PMOS transistor 104; the drain is electrically coupled to the source of NMOS transistor 107 and the drain of NMOS transistor 106; and the gate is electrically coupled to the first voltage source. As for NMOS transistor 106, the source, drain and gate are electrically coupled to the drain of PMOS transistor 103, the drain of NMOS transistor 105 and the source of NMOS transistor 107, and the second voltage source, respectively. As for NMOS transistor 107, the source, drain and gate are electrically coupled to the drain of NMOS transistors 105 and 106, the ground terminal, and a gate of transistor 130, respectively.

Still referring to FIG. 1, for PMOS transistor 108, the source is electrically coupled to the first voltage source, the drain is electrically coupled to the gate and source of NMOS transistor 109 and the gate is electrically coupled to the gates of PMOS transistors 103 and 104. Whereas, the source, drain and gate of PMOS transistor 109 are electrically coupled to the drain of PMOS transistor 108, the ground terminal, and the gate of NMOS transistor 102, respectively.

Still referring to FIG. 1, the electrical coupling between the gates of PMOS transistors 103 and 104 with the drain of PMOS transistor 103 is implemented to utilize a mirroring technique. The mirroring technique enables an electrical current flowing through a transistor, such as PMOS transistor 104, to be mirrored/copied from an electrical current flowing through another transistor, such as PMOS transistor 103, because the gate of PMOS transistor 104 is biased to the electrical current that is flowing through PMOS transistor 103. The electrical coupling of the drain of PMOS transistor 104 with the gate of PMOS transistor 101 is also implemented through a mirroring technique described herein. Hence, the current flowing through PMOS transistor 104 is identical or substantially equivalent with the electrical current flowing through PMOS transistor 101 due to the technique. The electrical coupling between the drain of PMOS transistor 103 to the gate of PMOS transistor 108 enables the mirroring technique. Therefore, the electrical current flowing across PMOS transistor 103 is substantially equivalent or identical to the electrical current flowing through PMOS transistor 108. The electrical coupling of the drain of PMOS transistor 109 with the gates of NMOS transistors 109 and 102 also enables the mirroring technique. Hence, the electrical current flowing across NMOS transistors 109 and 102 are identical or substantially equivalent to each other. Consequently, the electrical current flowing through PMOS transistor 101 is mirrored to NMOS transistor 102.

Figure 2:
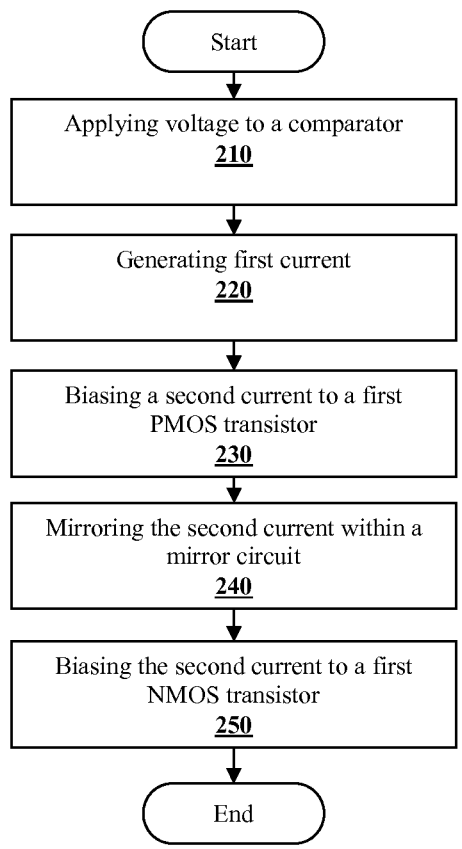
FIG. 2, meant to be illustrative and not limiting, illustrates a method to operate a comparator in accordance with one embodiment.

FIG. 2, meant to be illustrative and not limiting, illustrates a method to operate a comparator in accordance with one embodiment. Method 200 can be applicable to comparator 100 referred in FIG. 1. Method 200 includes applying a first voltage and a second voltage to the comparator as in operation 210. In one embodiment, the first voltage and the second voltage refers to the Vccl and the Vcchg, respectively. In another embodiment, the first and second voltages are associated with a low common mode voltage. The low common mode voltage is produced when low voltage supplies are provided to the comparator. It is appreciated that plurality of low voltages may only generate a low common mode voltage in one embodiment. The low common mode voltage places the transistors within the comparator into a linear region of an electrical current to voltage (I-V) relationship, which is illustrated further in FIG. 3. It should be appreciated that the low common mode voltage ranges typically depends on a process node, e.g., a low common mode voltage of 0.7V for 40 nm semiconductor process. In contrast, a high common mode voltage places the transistors within the comparator into a saturation region of the Current-to-Voltage (I-V) relationship, also illustrated in the I-V relationship in FIG. 3. The voltages are applied to the gates of NMOS transistors 105 and 106 as illustrated in FIG. 1 in one embodiment. Method 200 also includes generating a first electrical current within the comparator as in operation 220. In one embodiment, the first electrical current is an electrical current propagating through NMOS transistor 107 of FIG. 1. The first electrical current is generated by the first and second voltages. The electrical current propagating through remaining circuits of the comparator, e.g., the transistors 103-106 and 108-109 of FIG. 1, is not identical to the first electrical current, i.e., NMOS transistor 107 of FIG. 1. In one embodiment, the electrical current propagating across the remaining circuits is at least half an amount of the first electrical current generated by the first and second voltages.

Still referring to FIG. 2, the electrical current propagating within the remaining comparator may be referred to as a second electrical current. The second electrical current is supplied to a first PMOS transistor as in operation 230. In one embodiment, the first PMOS transistor is PMOS transistor 101 of FIG. 1, and the gate of the first PMOS transistor is biased/electrically coupled with the second electrical current. Therefore, the electrical current that propagates across the first PMOS transistor is the second electrical current. Method 200 also includes mirroring the second electrical current within a mirror circuit as in operation 240. In one embodiment, the mirror circuit refers to mirror circuit 120 of FIG. 1, with the transistors within the mirror circuit utilizing a plurality of the current mirroring techniques. The second electrical current that propagates across the first PMOS transistor is mirrored/copied across the remaining transistors within the comparator. In one embodiment, PMOS transistors 103, 104 and 108 of FIG. 1 have the second electrical current flowing through the transistors. NMOS transistors 105, 106 and 109 also have the second electrical current flowing through the transistors. Method 200 also includes biasing a first NMOS transistor with the second electrical current as in operation 250. The second electrical current, which is mirrored across the mirror circuit, is then supplied to the gates of the first NMOS transistor. In one embodiment, the first NMOS transistor is NMOS transistor 102 of FIG. 1. Therefore, NMOS transistor 102 also propagates the second electrical current as a result of the mirroring techniques described herein. As such, the electrical current propagating across the first PMOS transistor and the first NMOS transistor are substantially equivalent or identical to the second electrical current. It should be appreciated that identical or substantially equivalent refers to either zero or substantially no offset between the electrical currents.

Figure 3:
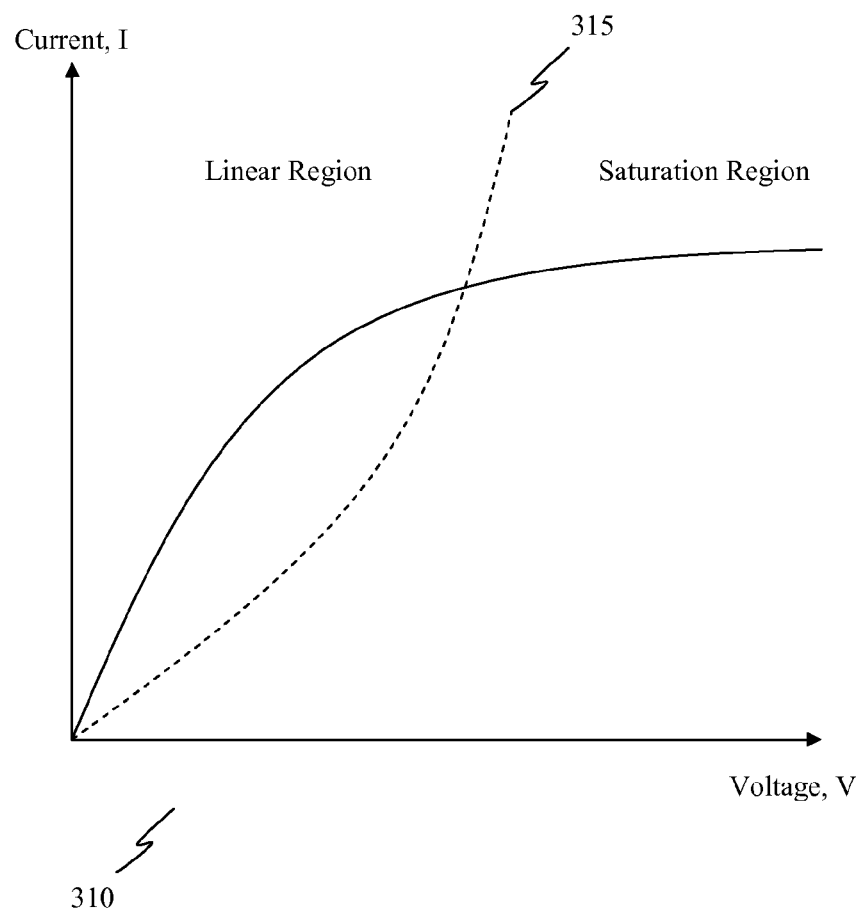
FIG. 3, meant to be illustrative and not limiting, illustrates a current to voltage relationship within a comparator.

FIG. 3, meant to be illustrative and not limiting, illustrates a current to voltage (I-V) relationship for a comparator. I-V relationship 310 illustrates impacts of varying an applied voltage to an electrical current within the comparator. The comparator refers to comparator 100 in FIG. 1 or the comparator that utilizes method 200 in described in FIG. 2. In one embodiment, the I-V relationship 310 is applicable to a transistor. The voltage axis within the I-V relationship 310 is referring to a voltage applied across a drain and a source, e.g., voltages applied across the drain and the source of NMOS transistor 105 of FIG. 1. The electrical current axis within I-V relationship 310 refers to a current flowing across the drain, e.g., current flowing across the drain of NMOS transistor 105 of FIG. 1. It should be appreciated that I-V relationship 310 varies as the voltage across the gate of the transistor varies. I-V relationship 310 is split into two regions, i.e., a linear region and a saturation region, by the boundary line 315. Within a linear region, characteristics of the comparator are equivalent or almost identical to a resistor, i.e., as the amount of voltage increases, the amount of electrical current generated within the comparator also increases with a specific gradient. Whereas, characteristics of the comparator within the saturation region are such that as voltage is increased the electrical current remains almost constant. The comparator goes into saturation region once the amount of voltage is increased above a specific value, i.e., beyond the intersection provided by boundary line 315. Therefore, comparator 100 in FIG. 1, places the characteristics of both PMOS transistor 101 and NMOS transistor 102 into identical regions, i.e., linear or saturation region, when either low or high common mode voltages are applied to comparator 100, according to I-V relationship 310. In contrast, for the conventional comparator, the PMOS transistor and the NMOS transistor can be placed within a different I-V region, hence providing a large electrical current offset. A person skilled in the art appreciates that for each process node, e.g., 20 nm, 28 nm, 32 nm, etc, I-V relationship 310 changes.

Figure 4:
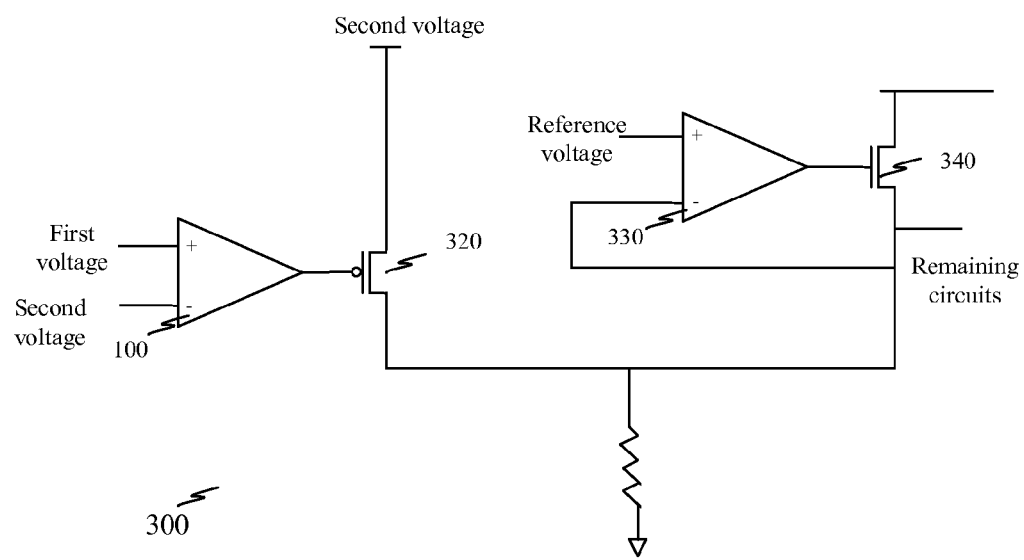
FIG. 4, meant to be illustrative and not limiting, illustrates a comparator system in accordance with one embodiment.

FIG. 4, meant to be illustrative and not limiting, illustrates a comparator system in accordance with one embodiment. Comparator system 300 includes comparator 100, PMOS transistor 320, voltage regulator 330 and NMOS transistor 340. In another embodiment, comparator 100 within comparator system 300 operates according to method 200 of FIG. 2. Comparator 100 is provided with two voltages, i.e., first and second voltages. The voltages are compared and differences between the voltages will drive PMOS transistor 320. The gate, source and drain of PMOS transistor 320 are coupled to an output of comparator 310, the second voltage source, and voltage regulator 330, respectively. In one embodiment, voltage regulator 330 is an operational amplifier (op-amp). Voltage regulator 330 is provided with negative feedback. It should be appreciated that the negative feedback applied to voltage regulator 330 provides an output voltage that increases/decreases in accordance to a differential gain. The output of the voltage regulator biases NMOS transistor 340. The source, drain and gate of NMOS transistor 340 are coupled to a reference voltage (Vref), an output that is coupled to remaining circuits, and the output of voltage regulator 330, respectively. It should be appreciated that the source of NMOS transistor 340 is at a second voltage under normal operation, i.e., after a power up sequence within an IC. In one embodiment, low voltages supplied to comparator 100 do not provide a high electrical current to the gates of PMOS transistor 320.

Figure 5:
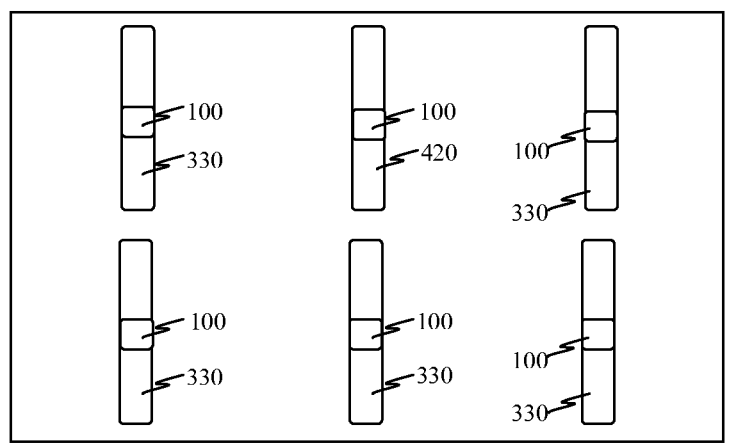
FIG. 5, meant to be illustrative and not limiting, illustrates a diagram of Programmable Logic Device (PLD) or an Integrated Circuit (IC) with comparators in accordance with one embodiment.

FIG. 5, meant to be illustrative and not limiting, illustrates an IC with comparators in accordance with one embodiment. IC 400 includes comparators 100 and voltage regulators 330. In one embodiment, IC 400 is a programmable logic device (PLD), e.g., a FPGA. In another embodiment, IC 400 is an Application Specific Integrated circuit (ASIC) or an Application Specific Standard Product (ASSP). In another embodiment, comparators 100 operate according to method 200 in FIG. 2. Voltage regulators 330 provide a constant voltage to remaining circuits within IC 400. In one embodiment, voltage regulators 330 are placed in two regions of IC 400, i.e., an upper voltage regulator region and a lower voltage regulator region. Comparators 100 are than placed between the upper and lower voltage regulator regions. It should be appreciated that the positions of voltage regulators 330 and comparators 100 within IC 400 should not be limited as per depicted within FIG. 4.

The embodiments, thus far, were described with respect to integrated circuits. The method and apparatus described herein may be incorporated into any suitable circuit. For example, the method and apparatus may be incorporated into numerous types of devices such as microprocessor, programmable logic devices (PLDs), application specific standard products (ASSPs) or application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), just name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by the assignee.

Although the method of operations were described in a specific order, it should be understood that other operation may be performed between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A comparator, comprising:
   a mirror circuit that is coupled to a first voltage source and a second voltage source;
   a first P-type Metal Oxide Semiconductor (PMOS) transistor coupled to the first voltage source and an output terminal of the comparator, wherein the first PMOS transistor is biased by an output of the mirror circuit; and
   a first N-type Metal Oxide Semiconductor (NMOS) transistor coupled to a ground terminal and the output terminal of the comparator, wherein the first NMOS transistor is biased by the output of the mirror circuit, and wherein a current level flowing through the first NMOS transistor is substantially equivalent to a current level flowing through the first PMOS transistor;
   wherein the mirror circuit further comprises:
      a second PMOS transistor, wherein a drain of the second PMOS transistor is coupled to a gate of the first PMOS transistor;
      a third PMOS transistor, wherein a gate of the third PMOS transistor is coupled to the gate of the second PMOS transistor and to a drain of the third PMOS transistor;
      a second NMOS transistor, wherein a gate of the second NMOS transistor is coupled to the second voltage source, wherein a drain of the second NMOS transistor is coupled to the drain of the second PMOS transistor;
      a third NMOS transistor, wherein a gate of the third NMOS transistor is coupled to the first voltage source, wherein a drain of the third NMOS transistor is coupled to a drain of the third PMOS transistor;
      a fourth NMOS transistor, wherein a drain of the fourth NMOS transistor is coupled to a source of the second NMOS transistor and a source of the third NMOS transistor;
      a fourth PMOS transistor, wherein a gate of the fourth PMOS transistor is coupled to the drain of the third PMOS transistor and the drain of the third NMOS transistor; and
      a fifth NMOS transistor, wherein a drain of the fifth NMOS transistor is coupled to a drain of the fourth PMOS transistor, and wherein a gate of the fifth NMOS transistor is coupled to a gate of the first NMOS transistor and the drain of the fifth NMOS transistor.

2. The comparator in claim 1, wherein the first voltage source and the second voltage source provide voltages representative of a current to voltage relationship of a linear region for the mirror circuit, wherein the linear region provides an increase of voltage responsive to an increase of current.

3. The comparator in claim 1, wherein the current level flowing across the first PMOS transistor has zero offset compared to the current level flowing through the first NMOS transistor.

4. The comparator in claim 1, wherein the current flowing through the first NMOS transistor and the first PMOS transistor is mirrored through the mirror circuit.

5. The comparator in claim 1, wherein values of electrical current flowing through the first PMOS transistor, the second PMOS transistor, the third PMOS transistor, the second NMOS transistor and the third NMOS transistor are substantially equivalent.

6. The comparator in claim 1, wherein the fourth NMOS transistor has at least twice an amount of current flow than current flowing through the first PMOS transistor.

7. The comparator in claim 1, wherein values of electrical current flowing through the fourth PMOS transistor, the fifth NMOS transistor and the first NMOS transistor are substantially identical.

8. The comparator of claim 1, wherein the output of the mirror circuit is provided by the drain of the second NMOS transistor coupled to the drain of the second PMOS transistor, as biasing the gate of the first PMOS transistor, and by the drain of the fifth NMOS transistor coupled to the drain of the fourth PMOS transistor, as biasing the gate of the first NMOS transistor.

9. The comparator of claim 1, wherein the output terminal of the comparator is provided by the drain of the first PMOS transistor coupled to the drain of the first NMOS transistor.

10. A comparator, comprising:
    a mirror circuit that is coupled to a first voltage source and a second voltage source;
    a first P-type Metal Oxide Semiconductor (PMOS) transistor biased by an output of the mirror circuit; and
    a first N-type Metal Oxide Semiconductor (NMOS) transistor biased by the output of the mirror circuit;
    wherein the mirror circuit further comprises:
       a second PMOS transistor, wherein a drain of the second PMOS transistor is coupled to a gate of the first PMOS transistor;
       a third PMOS transistor, wherein a gate of the third PMOS transistor is coupled to a gate of the second PMOS transistor and to a drain of the third PMOS transistor;
       a second NMOS transistor, wherein a gate of the second NMOS transistor is coupled to the second voltage source, wherein a drain of the second NMOS transistor is coupled to the drain of the second PMOS transistor;
       a third NMOS transistor, wherein a gate of the third NMOS transistor is coupled to the first voltage source, wherein a drain of the third NMOS transistor is coupled to a drain of the third PMOS transistor;

a fourth PMOS transistor, wherein a gate of the fourth PMOS transistor is coupled to the drain of the third PMOS transistor and the drain of the third NMOS transistor; and a fourth NMOS transistor, wherein a drain of the fourth NMOS transistor is coupled to a drain of the fourth PMOS transistor, and wherein a gate of the fourth NMOS transistor is coupled to a gate of the first NMOS transistor and the drain of the fourth NMOS transistor.

11. The comparator of claim 10 further comprising;

a fifth NMOS transistor wherein a drain of the fifth NMOS transistor is coupled to a source of the second NMOS transistor and a source of the third NMOS transistor.

12. The comparator in claim 10, wherein the first voltage source and the second voltage source provide voltages representative of a current to voltage relationship of a linear region for the mirror circuit, wherein the linear region provides an increase of voltage responsive to an increase of current.

13. The comparator in claim 10, wherein the current level flowing across the first PMOS transistor has zero offset compared to the current level flowing through the first NMOS transistor.

14. The comparator in claim 10, wherein the current flowing through the first NMOS transistor and the first PMOS transistor is mirrored through the mirror circuit.

15. The comparator in claim 10, wherein values of electrical current flowing through the first PMOS transistor, the second PMOS transistor, the third PMOS transistor, the second NMOS transistor and the third NMOS transistor are substantially equivalent.

16. The comparator in claim 11, wherein the fifth NMOS transistor has at least twice an amount of current flow than current flowing through the first PMOS transistor.

17. The comparator in claim 10, wherein values of electrical current flowing through the fourth PMOS transistor, the fourth NMOS transistor and the first NMOS transistor are substantially identical.

* * * * *